United States Patent
Lee et al.

(10) Patent No.: US 10,332,964 B2
(45) Date of Patent: Jun. 25, 2019

(54) SINGLE POLY ELECTRICAL ERASABLE PROGRAMMABLE READ ONLY MEMORY (EEPROM)

(71) Applicant: UNITED MICROELECTRONICS CORP., Hsin-Chu (TW)

(72) Inventors: Chih-Haw Lee, New Taipei (TW); Tzu-Ping Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 139 days.

(21) Appl. No.: 15/352,587

(22) Filed: Nov. 16, 2016

(65) Prior Publication Data
US 2018/0114793 A1    Apr. 26, 2018

(30) Foreign Application Priority Data
Oct. 21, 2016 (CN) .......................... 2016 1 0919625

(51) Int. Cl.
*H01L 29/08*      (2006.01)
*H01L 29/66*      (2006.01)
*H01L 29/423*     (2006.01)
*H01L 29/788*     (2006.01)
*H01L 27/11558*   (2017.01)

(52) U.S. Cl.
CPC .... *H01L 29/0847* (2013.01); *H01L 27/11558* (2013.01); *H01L 29/66825* (2013.01); *H01L 29/7883* (2013.01); H01L 29/4238 (2013.01); H01L 29/42368 (2013.01)

(58) Field of Classification Search
CPC ......... H01L 27/11524; H01L 27/11519; H01L 29/7883; H01L 29/0847; H01L 29/42324; H01L 29/4238; H01L 29/7887; H01L 29/42368; H01L 29/42328; H01L 27/11558; H01L 29/66825
See application file for complete search history.

(56) References Cited

U.S. PATENT DOCUMENTS

| 6,177,315 B1 * | 1/2001 | Bergemont ........... H01L 27/115 257/E21.682 |
| 6,177,703 B1 | 1/2001 | Cunningham |
| 7,253,057 B1 * | 8/2007 | Lojek .................... H01L 27/115 257/E21.69 |
| 8,026,545 B2 * | 9/2011 | Sekiguchi .......... G11C 16/0408 257/202 |
| 8,648,406 B2 | 2/2014 | Kim |

(Continued)

Primary Examiner — Mohsen Ahmadi
Assistant Examiner — Scott E Bauman
(74) Attorney, Agent, or Firm — Winston Hsu

(57) ABSTRACT

A single poly electrical erasable programmable read only memory (EEPROM) includes a source, a drain, a dielectric layer and an electrode layer. The source and the drain are located in a substrate, wherein the source and the drain have a first conductive type. The dielectric layer is disposed on the substrate and between the source and the drain, wherein the dielectric layer includes a first dielectric layer having two tunnel dielectric parts separating from each other, and thicknesses of the two tunnel dielectric parts are thinner than thicknesses of the other parts of the first dielectric layer. The electrode layer is disposed on the dielectric layer, wherein the electrode layer includes a first electrode disposed on the first dielectric layer, thereby the first electrode being a floating gate.

13 Claims, 2 Drawing Sheets

(56) References Cited

U.S. PATENT DOCUMENTS

| | | | |
|---|---|---|---|
| 9,490,016 B2* | 11/2016 | Chen ................. | G11C 16/0416 |
| 2006/0267071 A1* | 11/2006 | Carver ............... | H01L 29/7883 |
| | | | 257/315 |
| 2015/0085585 A1* | 3/2015 | Horch .................... | G11C 16/14 |
| | | | 365/185.28 |
| 2016/0049413 A1* | 2/2016 | Chen ................. | G11C 16/0416 |
| | | | 365/185.18 |

* cited by examiner

US 10,332,964 B2

SINGLE POLY ELECTRICAL ERASABLE PROGRAMMABLE READ ONLY MEMORY (EEPROM)

BACKGROUND OF THE INVENTION

1. Field of the Invention

The present invention relates generally to a single poly electrical erasable programmable read only memory (EEPROM), and more specifically to a single poly electrical erasable programmable read only memory (EEPROM) including two tunnel dielectric parts.

2. Description of the Prior Art

An EEPROM (electrically erasable programmable read only memory) provides excellent performance. Thanks to voltages required for programming and erasing being self-generated, only an external source is required for operation. Programming and erasing is carried out in each memory cell for recording a bit data. Charges can be trapped in a floating gate and thus the characteristic of each memory cell can be changed to store data bit "0" or data bit "1". Each memory cell consists of two MOS transistors, wherein one storage transistor having a floating gate is used for trapping charges while the other access transistor is used for operation. Proper bias voltages are applied while programming and erasing the EEPROM (electrically erasable programmable read only memory). For instance, while the EEPROM (electrically erasable programmable read only memory) is erased, charges are injected into the floating gate, and the transistor stores a data bit "1"; while the EEPROM (electrically erasable programmable read only memory) is programmed, charges are removed from the floating gate, and the transistor stores a data bit "0".

For programming and erasing the EEPROM (electrically erasable programmable read only memory), a tunneling dielectric layer must be disposed between a substrate and the floating gate, thereby charges being trapped in or removed from the floating gate through the tunneling dielectric layer while applying proper bias voltages. Thus, the structure, the material and the charge tunneling frequency of the tunneling dielectric layer affect life time of the EEPROM (electrically erasable programmable read only memory). Specifically, these properties affect life time of the EEPROM (electrically erasable programmable read only memory) in a high temperature atmosphere.

SUMMARY OF THE INVENTION

The present invention provides a single poly electrical erasable programmable read only memory (EEPROM), which includes a dielectric layer having at least two separated tunnel dielectric parts right below a floating gate, thereby these separated tunnel dielectric parts sharing charge tunneling times while programming and erasing. Thus, the present invention increases life time of the single poly electrical erasable programmable read only memory (EEPROM).

The present invention provides a single poly electrical erasable programmable read only memory (EEPROM) including a source, a drain, a dielectric layer and an electrode layer. The source and the drain are located in a substrate, wherein the source and the drain have a first conductive type. The dielectric layer is disposed on the substrate and between the source and the drain, wherein the dielectric layer includes a first dielectric layer, the first dielectric layer has two separated tunnel dielectric parts, and thicknesses of the two tunnel dielectric parts are thinner than a thickness of a memory channel of the first dielectric layer. The electrode layer is disposed on the dielectric layer, wherein the electrode layer includes a first electrode disposed on the first dielectric layer, thereby the first electrode being a floating gate.

According to the above, the present invention provides a single poly electrical erasable programmable read only memory (EEPROM), which has at least two separated tunnel dielectric parts, thereby increasing life time of the single poly electrical erasable programmable read only memory (EEPROM). More precisely, a first dielectric layer has the two isolated tunnel dielectric parts right below a floating gate, and the thicknesses of the tunnel dielectric parts are thinner than the thickness of the other part of the first dielectric layer, therefore charges only can pass through the tunnel dielectric parts under specific bias voltages and be trapped in the floating gate without passing through the other part of the first dielectric layer. In this way, charges can only pass through one of the tunnel dielectric parts during each programming or erasing operation. This means a plurality of the tunnel dielectric parts can share charge tunneling frequency. Thus, the present invention increases life time of the single poly electrical erasable programmable read only memory (EEPROM).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
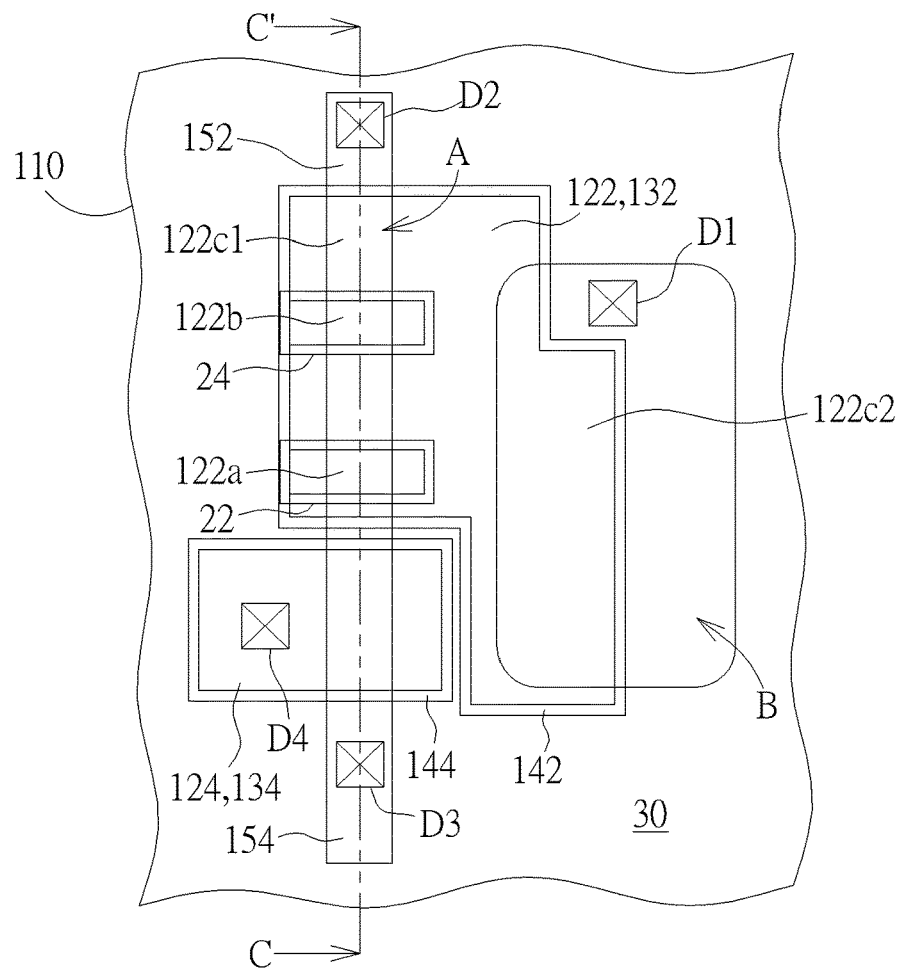
FIG. 1 schematically depicts a top view of a single poly electrical erasable programmable read only memory (EEPROM) according to an embodiment of the present invention.
Figure 2:
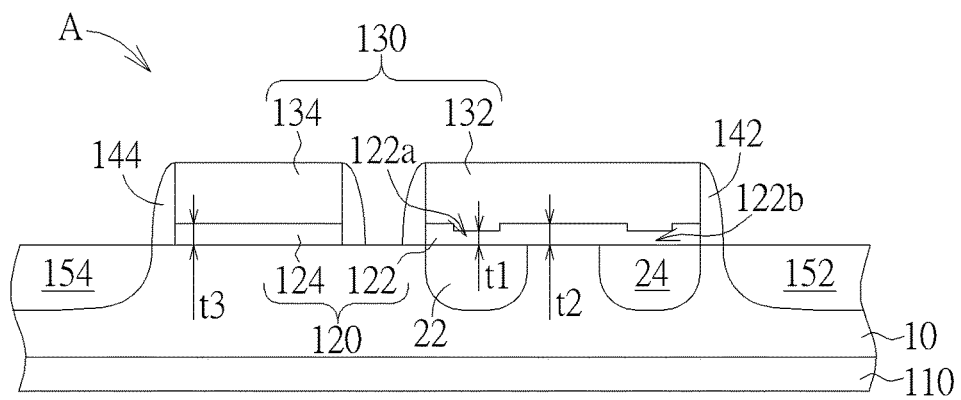
FIG. 2 schematically depicts a cross-sectional view of a single poly electrical erasable programmable read only memory (EEPROM) according to an embodiment of the present invention.

FIG. 1 schematically depicts a top view of a single poly electrical erasable programmable read only memory (EEPROM) according to an embodiment of the present invention. FIG. 2 schematically depicts a cross-sectional view of a single poly electrical erasable programmable read only memory (EEPROM) along CC' line of FIG. 1. FIGS. 1-2 are just one case of the single poly electrical erasable programmable read only memory (EEPROM) of the present invention, but it is not limited thereto. A single poly electrical erasable programmable read only memory (EEPROM) having a plurality of tunnel dielectric parts are included in the present invention.

Please refer to FIGS. 1-2, the substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. A well 10 may be formed blanketly in the substrate 110 by methods such as implanting. The well 10 has a second conductive type. Two doped regions 22/24 are respectively formed in the substrate 110 right below later-formed two tunnel dielectric parts, wherein the two doped regions 22/24 have a first conductive type. The first conductive type and the second conductive type have different conductive types. For example, the first conductive type is N-type while the second conductive type is P-type in this embodiment. In other embodiments, the first conductive type may be P-type while the second conductive type is N-type. The dopant concentration of the doped regions 22/24 is higher than the dopant concentration of the well 10. The doped regions 22/24 are used for enhancing charges tunneling into a later-formed floating gate.

At least an isolation structure 30 is formed in the substrate 110, thereby the substrate 110 being divided into a first active area A and a second active area B, and the first active area A being electrically isolated from the second active area B. The isolation structure 30 may be a shallow trench isolation (STI) structure, which may be formed by a shallow trench isolation (STI) process, but it is not limited thereto. FIG. 2 depicts a cross-sectional view of the single poly electrical erasable programmable read only memory (EEPROM) along CC' line of FIG. 1, meaning a longitudinal cross-sectional view of the first active area A. In this case, the first active area A and the second active area B are substrate 110 surrounded by the isolation structure 30; in other cases, the first active area A and/or the second active area B may be a fin structure protruding from the isolation structure 30.

A dielectric layer 120 and an electrode layer 130 are stacked on the substrate 110, wherein the dielectric layer 120 includes a first dielectric layer 122 and a second dielectric layer 124, and the electrode layer 130 includes a first electrode 132 and a second electrode 134. The dielectric layer 120 may be an oxide layer and the electrode layer 130 may be a polysilicon layer, but it is not limited thereto. In this embodiment, the first dielectric layer 122 and the second dielectric layer 124 have common materials, and the first electrode 132 and the second electrode 134 have common materials, hence simplifying processes and structures, but it is not limited thereto.

The first electrode 132 is a floating gate. The first dielectric layer 122 has two tunnel dielectric parts 122a/122b, wherein thicknesses t1 of the two tunnel dielectric parts 122a/122b are thinner than a thickness t2 of the other part of the first dielectric layer 122. In this embodiment, only two tunnel dielectric parts 122a/122b are presented, but it is not limited thereto. The single poly electrical erasable programmable read only memory (EEPROM) having a plurality of tunnel dielectric parts 122a/122b can be included in the present invention.

It is emphasized that only the tunnel dielectric parts 122a/122b are capable of having charges passing through and injected into the first electrode 132 under proper bias voltages, thus charges must pass through the tunnel dielectric parts 122a/122b easier than the other part of the first dielectric layer 122. Thereby, the thicknesses t1 of the tunnel dielectric parts 122a/122b are designed to be thinner than the thickness t2 of other part of the first dielectric layer 122, but it is not limited thereto. Due to at least two of the tunnel dielectric parts 122a/122b being disposed and these tunnel dielectric parts 122a/122b are electrically isolated from each other, times of charges passing through each of the tunnel dielectric parts 122a/122b can be shared. Hence, the single poly electrical erasable programmable read only memory (EEPROM) of the present invention can have longer lift time than the single poly electrical erasable programmable read only memory (EEPROM) only having single tunnel dielectric part.

In this embodiment, the tunnel dielectric part 122a and the tunnel dielectric part 122b have common thicknesses t1, and the other part of the first dielectric layer 122 has a uniform thickness t2, but it is not limited thereto. Due to the tunnel dielectric part 122a and the tunnel dielectric part 122b having common thicknesses t1, processes can be simplified. In other embodiments, the thicknesses of the tunnel dielectric part 122a and the tunnel dielectric part 122b may be different to achieve specific purposes, depending upon practical requirements.

The second electrode 134 is a selective gate. The second dielectric layer 124 has a uniform thickness t3. In this case, the thickness t3 of the second dielectric layer 124 is larger than the thicknesses t1 of the two tunnel dielectric parts 122a/122b. Thereby, charges can pass through the tunnel dielectric parts 122a/122b without passing through the second dielectric layer 124 under proper bias voltages. In some cases, the thickness t3 of the second dielectric layer 124 can equal to the thickness t2 of the other part of the first dielectric layer 122 to simplify processes and structures, but it is not limited thereto.

Methods of forming the dielectric layer 120 and the electrode layer 130 may include, but not limited to, the following. A dielectric layer (not shown) and an electrode layer (not shown) may blanketly cover the substrate 110. The method of forming the dielectric layer may include: forming a first dielectric layer and a second dielectric layer, removing a part of the first dielectric layer corresponding to the two tunnel dielectric parts 122a/122b, and then reforming the first dielectric layer and the second dielectric layer, therefore the thickness t1 of the two tunnel dielectric parts 122a/122b being thinner than the thickness t2 of the other part of the first dielectric layer 122. Then, the electrode layer (not shown) and the dielectric layer (not shown) are patterned to form a structure having a lower dielectric layer 120 and an upper electrode layer 130. More precisely, the dielectric layer 120 may include a first dielectric layer 122 and a second dielectric layer 124, and the electrode layer 130 may include a first electrode 132 and a second electrode 134. Spacers 142 may be formed beside the first dielectric layer 122 and the first electrode 132, and spacers 144 may be formed beside the second dielectric layer 124 and the second electrode 134. In this embodiment, the spacers 142 and the spacers 144 may be formed simultaneously by one same process, but it is not limited thereto. The spacers 142 and the spacers 144 may be single layer spacers or multilayer spacers, which may be composed of silicon nitride, silicon oxide or/and silicon oxynitride, etc. A source 152 and a drain 154 may be formed in the substrate 110 beside one of the spacers 142 and one of the spacers 144. The source 152 and the drain 154 may have a first conductive type. In this embodiment, the first conductive type is N-type.

A contact dot D1 may be formed beside the first electrode 132 (floating gate). The contact dot D1, a contact plug D2 connecting the source 152, a contact plug D3 connecting the drain 154, and a contact plug D4 connecting the second electrode 134 may be formed at the same time. Methods of forming the contact dot D1, the contact plug D2, the contact plug D3 and the contact plug D4 are well known in the art, and are not described herein.

As shown in FIG. 1, the source 152, the drain 154, the two tunnel dielectric parts 122a/122b and a memory channel 122c1 of the first dielectric layer 122 right below the first electrode 132 (floating gate) are disposed on the first active area A of the substrate 110. The first dielectric layer 122, the first electrode 132, the second dielectric layer 124 and the second electrode 134 disposed on the first active area A constitute two individual transistors. A memory coupling capacitor 122c2 of the first dielectric layer 122 and a part of the first electrode 132 are disposed in the second active area B. In the first active area A, the thickness t3 of the second dielectric layer 124 equals to the thickness t2 of the other part of the first dielectric layer 122, as shown in FIG. 2. This means the thickness t3 of the second dielectric layer 124 equals to the thickness t2 of the memory channel 122c1 of the first dielectric layer 122, but the thickness t3 of the second dielectric layer 124 may be equal to or be different from the thickness of the memory coupling capacitor 122c2 of the first dielectric layer 122, depending upon practical requirements. In this case, the thicknesses t1 of the tunnel dielectric parts 122a/122b are common to the thickness of the memory coupling capacitor 122c2 of the first dielectric layer 122 for simplifying processes and structures.

In a preferred embodiment, the doped regions 22/24 vertically overlap the tunnel dielectric parts 122a/122b respectively as shown in FIG. 2, or the doped regions 22/24 vertically surround the tunnel dielectric parts 122a/122b as shown in FIG. 1, to enhance charges passing through the tunnel dielectric parts 122a/122b and being injected into the first electrode 132. The present invention can increase life time of a formed single poly electrical erasable programmable read only memory (EEPROM) by setting at least two tunnel dielectric parts 122a/122b electrically isolated from each other.

Figure 3:
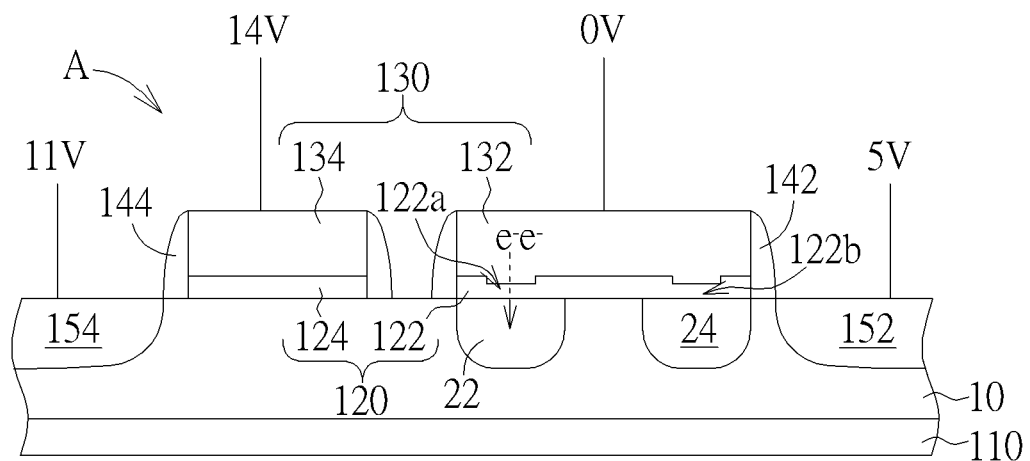
FIG. 3 schematically depicts a cross-sectional view of programming a single poly electrical erasable programmable read only memory (EEPROM) according to an embodiment of the present invention.
Figure 4:
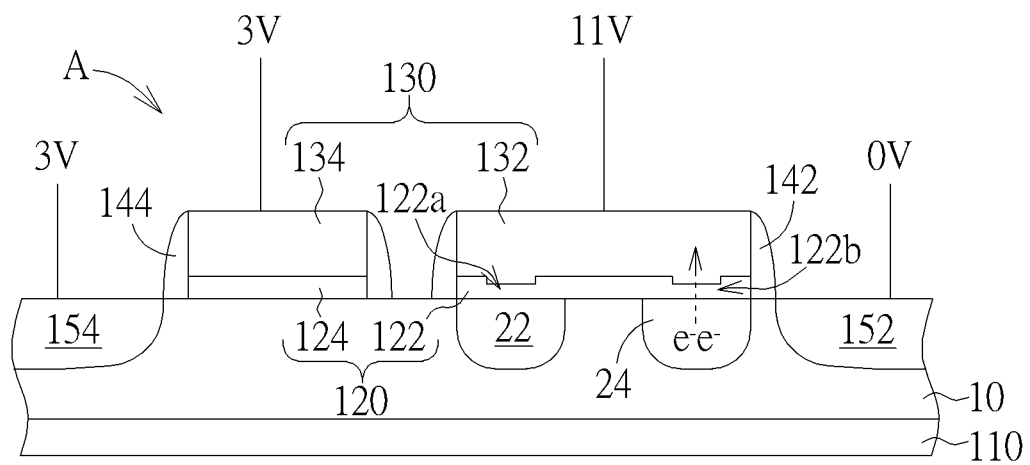
FIG. 4 schematically depicts a cross-sectional view of erasing a single poly electrical erasable programmable read only memory (EEPROM) according to an embodiment of the present invention.

FIG. 3 schematically depicts a cross-sectional view of programming a single poly electrical erasable programmable read only memory (EEPROM) according to an embodiment of the present invention. While the single poly electrical erasable programmable read only memory (EEPROM) is programmed, voltage of 5 volts can be applied to the source 152, voltage of 0 volts is connected to the first electrode 132, voltage of 14 volts is applied to the second electrode 134, voltage of 11 volts is applied to the drain 154, and voltage of 0 volts is connected to the substrate 110. Therefore, charges can be removed from the first electrode 132 by passing through the tunnel dielectric parts 122a due to high voltage of the doped region 22 relative to the first electrode 132. FIG. 4 schematically depicts a cross-sectional view of erasing a single poly electrical erasable programmable read only memory (EEPROM) according to an embodiment of the present invention. While the single poly electrical erasable programmable read only memory (EEPROM) is erased, voltage of 0 volts can be connected to the source 152, voltage of 11 volts is applied to the first electrode 132, voltage of 3 volts is applied to the second electrode 134, voltage of 3 volts is applied to the drain 154, and the substrate 110 is floated. Therefore, charges of the doped region 24 can be trapped into the first electrode 132 by passing through the tunnel dielectric parts 122b due to high voltage of the first electrode 132 relative to the source 152. In this way, charges only pass through the tunnel dielectric part 122a and the tunnel dielectric part 122b once during one time programming and erasing operation. That is, charges only pass through the tunnel dielectric part 122a during one time programming, and charges only pass through the tunnel dielectric part 122b during one time erasing. Thus, the single poly electrical erasable programmable read only memory (EEPROM) of the present invention have twice the life time of a single poly electrical erasable programmable read only memory (EEPROM) only having single tunnel dielectric part, wherein charges must pass through this single tunnel dielectric part twice during one time programming and erasing operation.

To summarize, the present invention provides a single poly electrical erasable programmable read only memory (EEPROM), which has at least two separated tunnel dielectric parts, thereby increasing life time of the single poly electrical erasable programmable read only memory (EEPROM). More precisely, a first dielectric layer has the two isolated tunnel dielectric parts right below a floating gate, and the thicknesses of the tunnel dielectric parts are thinner than the thickness of the other part of the first dielectric layer (especially for the first dielectric layer in the first active area), therefore charges only can pass through the tunnel dielectric parts under specific bias voltages and be trapped in the floating gate without passing through the other part of the first dielectric layer. In this way, charges can only pass through one of the tunnel dielectric parts during each programming or erasing operation. This means a plurality of the tunnel dielectric parts can share charge tunneling frequency. Thus, the present invention increases life time of the single poly electrical erasable programmable read only memory (EEPROM).

Moreover, a selective gate is disposed beside the floating gate, and a thickness of a second dielectric layer right below the selective gate may equal to the thickness of the other part of the first dielectric layer (especially for the first dielectric layer in the first active area), and is larger than the thickness of the tunnel dielectric parts. Thereby, charges can be trapped into the floating gate by passing through the tunnel dielectric parts while applied proper bias voltages without passing through the second dielectric layer. Doped regions may be respectively disposed right below the tunnel dielectric parts. Preferably, the doped regions may vertically surround the tunnel dielectric parts to enhance charges being injected into the floating gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single poly electrical erasable programmable read only memory (EEPROM), comprising:
   a source and a drain located in a substrate, wherein the source and the drain have a first conductive type, and the substrate comprises a first active area and a second active area, and the first active area is isolated from the second active area by an isolation structure;
   a dielectric layer disposed on the substrate and between the source and the drain, wherein the dielectric layer comprises a first dielectric layer only partially overlapping the second active area, the first dielectric layer has two separated tunnel dielectric parts in the first active area, and thicknesses of the two tunnel dielectric parts are thinner than a thickness of a memory channel of the first dielectric layer;
   an electrode layer disposed on the dielectric layer, wherein the electrode layer comprises a first electrode disposed on the first dielectric layer, thereby the first electrode being a floating gate; and
   two doped regions respectively disposed right below the two tunnel dielectric parts without contacting the source, wherein there is no selective gate between the two doped regions and the source.

2. The single poly electrical erasable programmable read only memory (EEPROM) according to claim 1, wherein the dielectric layer comprises a second dielectric layer.

3. The single poly electrical erasable programmable read only memory (EEPROM) according to claim 2, wherein a thickness of the second dielectric layer is larger than the thicknesses of the two tunnel dielectric parts.

4. The single poly electrical erasable programmable read only memory (EEPROM) according to claim 3, wherein the thickness of the second dielectric layer equals to the thickness of the memory channel of the first dielectric layer.

5. The single poly electrical erasable programmable read only memory (EEPROM) according to claim 2, wherein the electrode layer comprises a second electrode, and the second electrode is disposed on the second dielectric layer, thereby the second electrode being a selective gate.

6. The single poly electrical erasable programmable read only memory (EEPROM) according to claim 1, wherein the two doped regions have a first conductive type.

7. The single poly electrical erasable programmable read only memory (EEPROM) according to claim 6, wherein the two doped regions vertically surround the two tunnel dielectric parts respectively.

8. The single poly electrical erasable programmable read only memory (EEPROM) according to claim 6, further comprising:
   a well located in the substrate, and the source and the drain located in the well, wherein the well has a second conductive type.

9. The single poly electrical erasable programmable read only memory (EEPROM) according to claim 8, wherein the first conductive type is N-type while the second conductive type is P-type.

10. The single poly electrical erasable programmable read only memory (EEPROM) according to claim 1, further comprising:
   a contact dot disposed beside the floating gate.

11. The single poly electrical erasable programmable read only memory (EEPROM) according to claim 10, wherein a memory coupling capacitor of the first dielectric layer and the contact dot are in the second active area.

12. The single poly electrical erasable programmable read only memory (EEPROM) according to claim 1, wherein the source, the drain, the two tunnel dielectric parts and the memory channel of the first dielectric layer right below the floating gate are in the first active area.

13. The single poly electrical erasable programmable read only memory (EEPROM) according to claim 12, wherein the dielectric layer comprises a second dielectric layer, and a thickness of the second dielectric layer equals to the thickness of the memory channel of the first dielectric layer in the first active area.

\* \* \* \* \*